United States Patent
Hung et al.

(10) Patent No.: US 9,318,334 B2
(45) Date of Patent: Apr. 19, 2016

(54) METHOD FOR FABRICATING SEMICONDUCTOR DEVICE

(71) Applicant: UNITED MICROELECTRONICS CORP., Hsin-Chu (TW)

(72) Inventors: Yu-Hsiang Hung, Tainan (TW); Ssu-I Fu, Kaohsiung (TW); Shih-Hung Tsai, Tainan (TW); Jyh-Shyang Jenq, Tainan (TW); Chih-Kai Hsu, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/469,606

(22) Filed: Aug. 27, 2014

(65) Prior Publication Data

US 2016/0064224 A1 Mar. 3, 2016

(51) Int. Cl.
| | |
|---|---|
| *H01L 21/336* | (2006.01) |
| *H01L 21/28* | (2006.01) |
| *H01L 29/66* | (2006.01) |
| *H01L 21/8234* | (2006.01) |
| *H01L 21/8238* | (2006.01) |
| *H01L 27/088* | (2006.01) |
| *H01L 29/78* | (2006.01) |
| *H01L 27/092* | (2006.01) |
| *H01L 21/308* | (2006.01) |

(52) U.S. Cl.
CPC .... *H01L 21/28132* (2013.01); *H01L 21/28035* (2013.01); *H01L 21/28158* (2013.01); *H01L 29/6656* (2013.01); *H01L 29/66795* (2013.01); *H01L 21/3086* (2013.01); *H01L 21/823431* (2013.01); *H01L 21/823821* (2013.01); *H01L 27/0886* (2013.01); *H01L 27/0924* (2013.01); *H01L 29/785* (2013.01)

(58) Field of Classification Search
CPC ............... H01L 21/823431; H01L 21/823821; H01L 29/66795; H01L 29/785; H01L 27/0886; H01L 27/0924; H01L 21/3086
USPC ......................................................... 438/300
See application file for complete search history.

(56) References Cited

U.S. PATENT DOCUMENTS

| 7,026,199 B2 * | 4/2006 | Lee ................................ 438/157 |
| 7,202,148 B2 | 4/2007 | Chen et al. |
| 2006/0084243 A1 * | 4/2006 | Zhang ................. H01L 21/0337 438/478 |
| 2006/0240610 A1 * | 10/2006 | Nowak et al. ................. 438/197 |
| 2013/0052793 A1 | 2/2013 | Shieh et al. |
| 2013/0134486 A1 * | 5/2013 | LiCausi ......................... 257/288 |
| 2013/0174103 A1 | 7/2013 | Shieh et al. |
| 2015/0035069 A1 * | 2/2015 | Hung et al. .................... 257/369 |

OTHER PUBLICATIONS

Lin, Title of Invention: Method for Manufacturing Semiconductor Structures, U.S. Appl. No. 13/859,720, filed Apr. 9, 2013.

* cited by examiner

*Primary Examiner* — Mary Wilczewski
(74) *Attorney, Agent, or Firm* — Winston Hsu; Scott Margo

(57) ABSTRACT

A method for fabricating semiconductor device is disclosed. The method includes the steps of: providing a substrate having a first region and a second region defined thereon; forming a plurality of fin-shaped structures on the substrate; forming a gate layer on the fin-shaped structures; forming a material layer on the gate layer; patterning the material layer for forming sacrificial mandrels on the gate layer in the first region; forming sidewall spacers adjacent to the sacrificial mandrels; removing the sacrificial mandrels; forming a patterned mask on the second region; and utilizing the patterned mask and the sidewall spacers to remove part of the gate layer.

8 Claims, 6 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of utilizing sidewall image transfer (SIT) process for fabricating gate structures.

2. Description of the Prior Art

Integrated circuit (IC) technologies are constantly being improved. Such improvements frequently involve scaling down device geometries to achieve lower fabrication costs, higher device integration density, higher speeds, and better performance. Lithography is frequently used for forming components of an integrated circuit device, where generally, an exposure tool passes light through a mask or reticle and focuses the light onto a resist layer of a wafer, resulting in the resist layer having an image of integrated circuit components therein. Forming device patterns with smaller dimensions is limited by a resolution of the exposure tool. For example, forming fin-like field effect (FinFET) devices with less than two fins is limited by current lithography resolution limits. Accordingly, although existing lithography techniques have been generally adequate for their intended purposes, as device scaling down continues, they have not been entirely satisfactory in all respects.

SUMMARY OF THE INVENTION

According to a preferred embodiment of the present invention, a method for fabricating semiconductor device is disclosed. The method includes the steps of: providing a substrate having a first region and a second region defined thereon; forming a plurality of fin-shaped structures on the substrate; forming a gate layer on the fin-shaped structures; forming a material layer on the gate layer; patterning the material layer for forming sacrificial mandrels on the gate layer in the first region; forming sidewall spacers adjacent to the sacrificial mandrels; removing the sacrificial mandrels; forming a patterned mask on the second region; and utilizing the patterned mask and the sidewall spacers to remove part of the gate layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
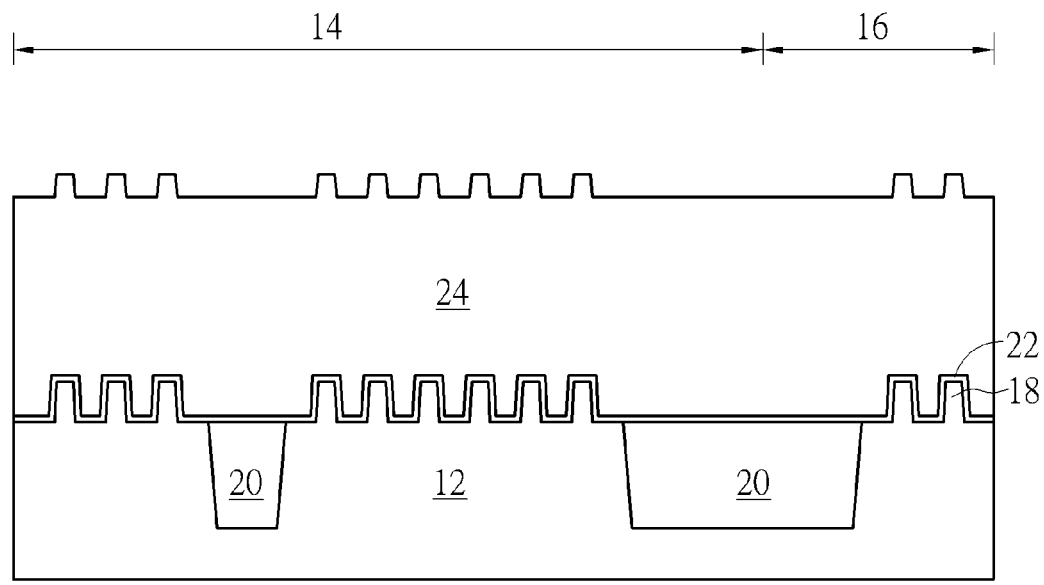
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12, such as a silicon substrate or silicon-on-insulator (SOI) substrate is first provided, and a first region 14 and a second region 16 are defined on the substrate 12. In this embodiment, the first region 14 is preferably a core region while the second region 16 is an input/output (I/O) region, but not limited thereto. A plurality of fin-shaped structures 18 is then formed on the substrate 12, in which the bottom of the fin-shapes structures 18 is preferably enclosed by an insulating layer, such as silicon oxide to form shallow trench isolation (STI) 20.

Preferably, the fin-shaped structures 18 of this embodiment are obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the underneath substrate, and through additional fin cut processes, desirable pattern structures, such as stripe patterned fin-shaped structures could be obtained.

After the fins-shaped structures 18 are formed, a gate dielectric layer 22 and a gate layer 24 are formed on the fin-shaped structures 18. The gate dielectric layer 22 is preferably composed of silicon oxide and the gate layer 24 is preferably composed of amorphous silicon or polysilicon, and most preferably amorphous silicon, but not limited thereto. It should be noted that as the gate layer 24 is deposited on the protruding fin-shaped structures 18, the top surface of the gate layer 24 would also reveal protruding profiles corresponding to the protrusion of the fin-shaped structures 18.

Figure 2:
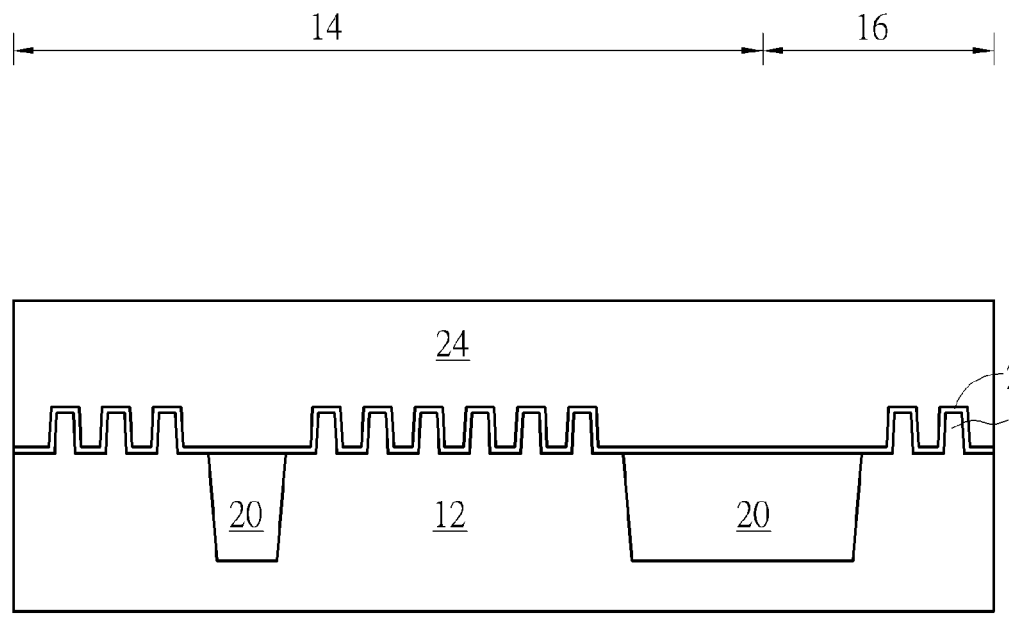

Next, as shown in FIG. 2, a planarizing process, such as a chemical mechanical polishing (CMP) process is conducted to planarize the gate layer 24 so that the protruding profiles corresponding to the fin-shaped structures 18 are planarized. After the planarizing process is conducted, the thickness of the gate layer 24 is approximately 1000 Angstroms.

Figure 3:
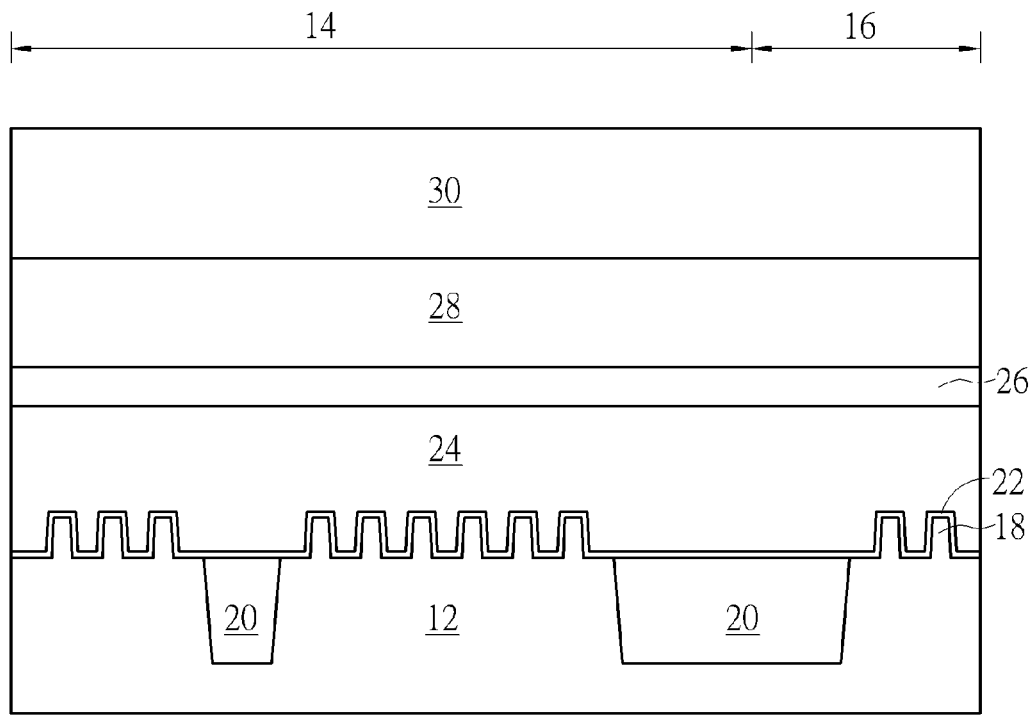

Next, as shown in FIG. 3, a first hard mask 26, a second hard mask 28, and a material layer 30 are deposited on the gate layer 24 sequentially. In this embodiment, the first hard mask 26 is preferably composed of silicon nitride, the second hard mask 28 is composed of silicon oxide, and the material layer 30 is composed of amorphous silicon.

Figure 4:
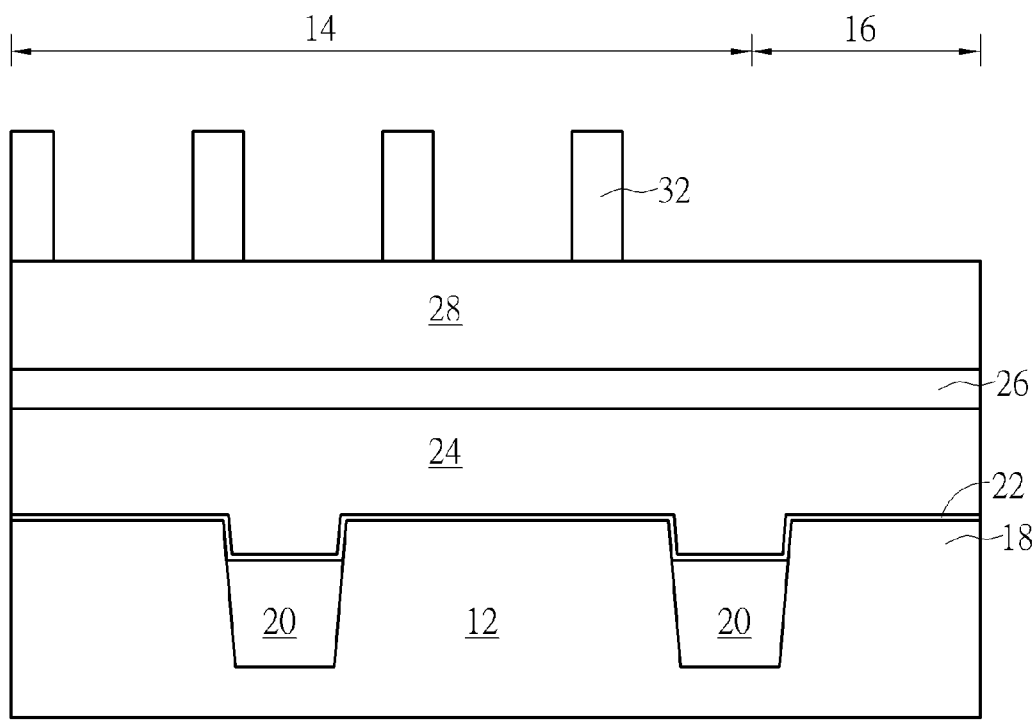

Next, as shown in FIG. 4, a photo-etching process is conducted to pattern the material layer 30 for forming a plurality of sacrificial mandrels 32 in the first region 14. The photo-etching process is preferably accomplished by first covering a patterned resist (not shown) on the first region 14 of the material layer 30, and an etching process is conducted to remove part of the material layer 30 not covered by the patterned resist in the first region 14 and all of the material layer 30 in the second region 16. It should be noted that instead of viewing the end portion of the fin-shaped structures 18 as shown in FIGS. 1-3, the structures from FIG. 4 on are viewed from the elongated portion of the fin-shaped structures.

Figure 5:
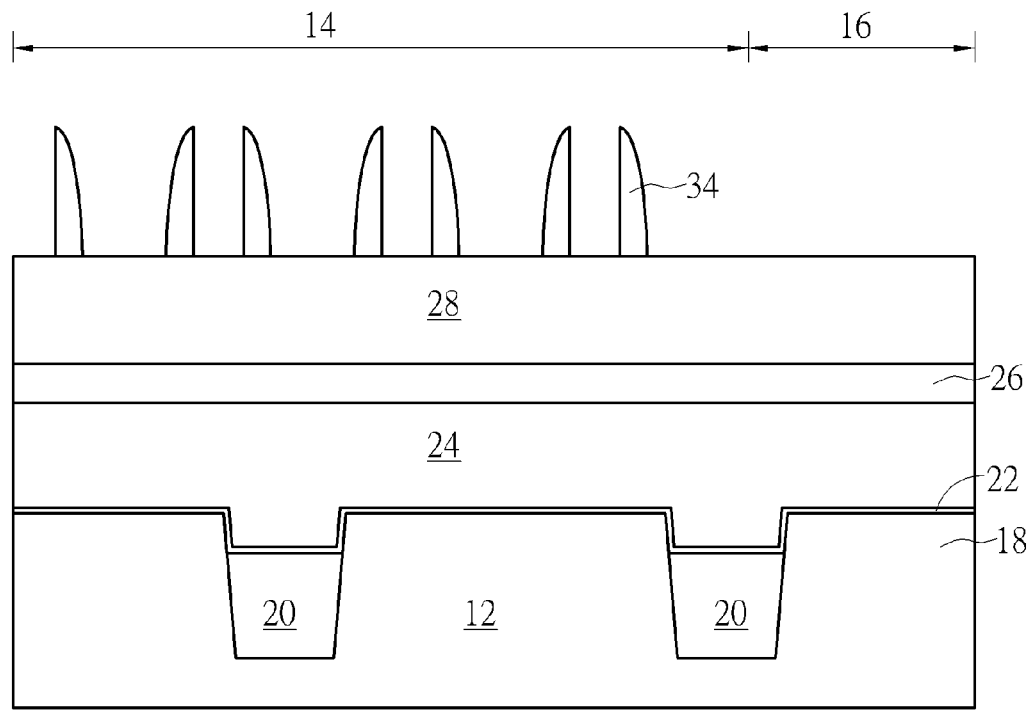

Next, as shown in FIG. 5, a plurality of sidewall spacers 34 are formed adjacent to the sacrificial mandrels 32. The formation of the sidewall spacers 34 could be accomplished by first depositing a silicon nitride layer on the second hard mask 28 and the sacrificial mandrels 32, and an etching back is conducted thereafter to remove part of the silicon nitride layer for forming the sidewall spacers 34. After the sidewall spacers 34 are formed, another etching process is conducted to remove the sacrificial mandrels 32. It should be noted that since the sidewall spacers 34 were formed around the sacrificial mandrels 32, the remaining sidewalls spacers 34 after the removal of the sacrificial mandrels 32 would be substantially rectangular shaped if viewed from the top.

Figure 6:
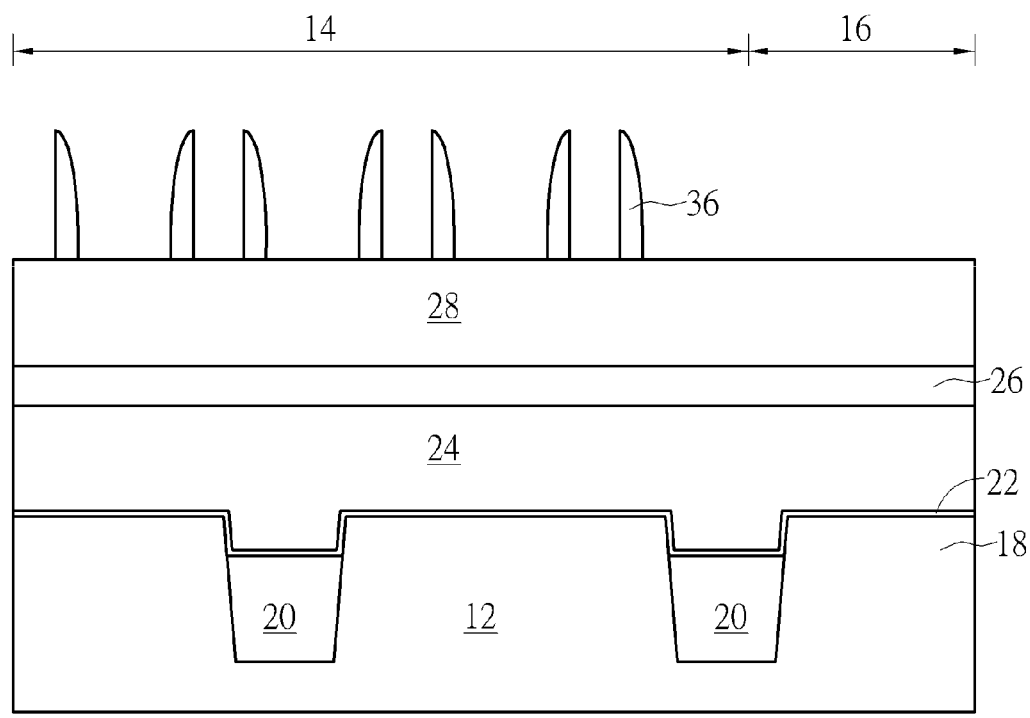

Next, as shown in FIG. 6, a gate slot cut patterning process could be conducted to remove unwanted sidewall spacer patterns while turning the rectangular shaped sidewall spacers 34 into individual columnar shaped sidewall spacers. For instance, a photo-etching process could be conducted by first forming a patterned resist (not shown) on the second hard mask 28, and then conducting an etching process to remove part of the sidewall spacers 34 for forming a plurality of columnar shaped sidewall spacers. After individual columnar sidewall spacers are formed, a trimming process could be conducted to trim the sidewall spacers 34 for forming trimmed sidewall spacers 36.

Figure 7:
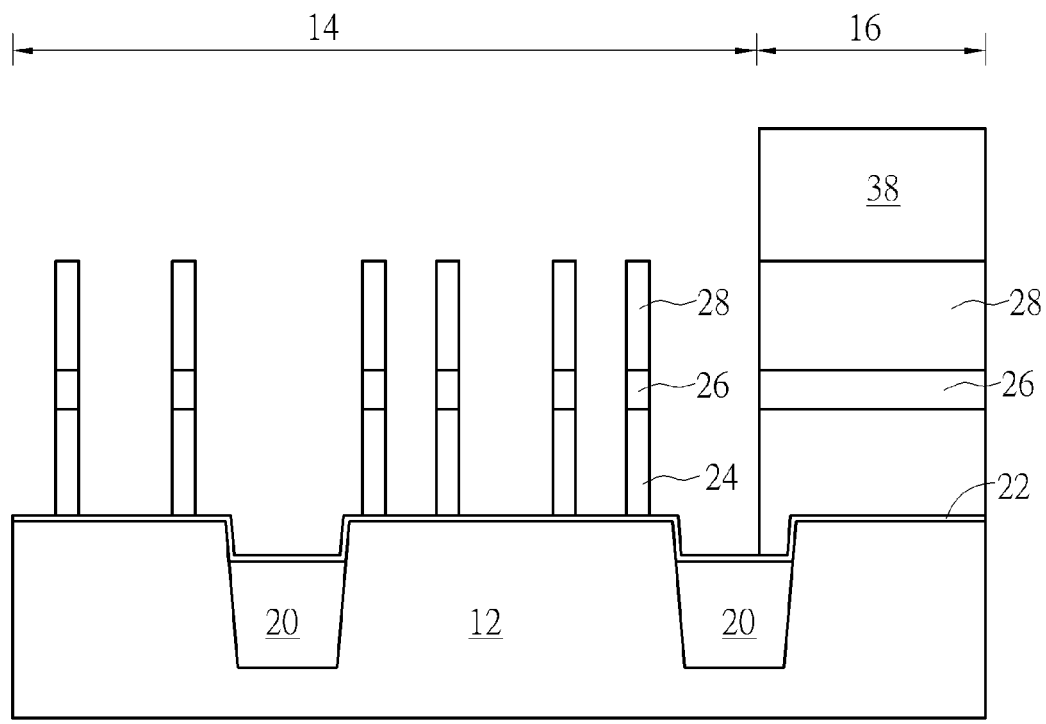

Next, as shown in FIG. 7, a patterned mask 38 is formed on the second region 16, and an etching process is conducted by using the patterned mask 38 and the trimmed sidewall spacers 36 as mask to remove part of the second hard mask 28, part of the first hard mask 26, and part of the gate layer 24. After removing the second hard mask 28 and the first hard mask 26, a plurality of gate structures is formed on the substrate 12 and typical FinFET elements including spacers and source/drain regions could be formed adjacent to the gate structures thereafter. This completes the fabrication of a semiconductor device according to a preferred embodiment of the present invention.

Figure 8:
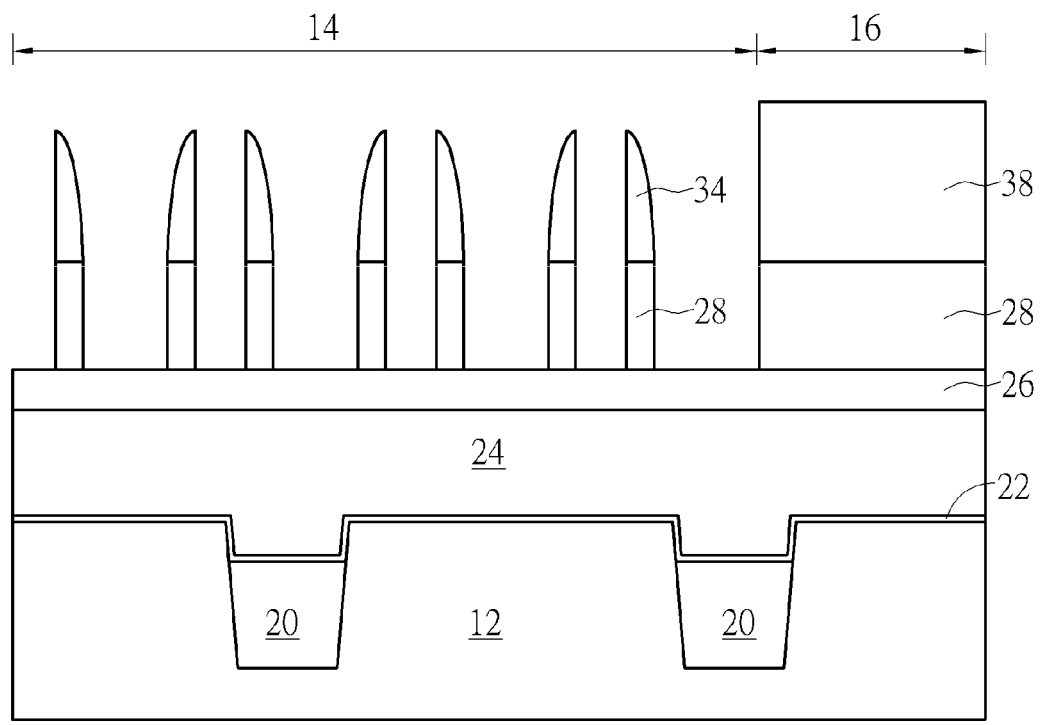
FIGS. 8-9 illustrate another approach for fabricating semiconductor device according to an embodiment of the present invention.
Figure 9:
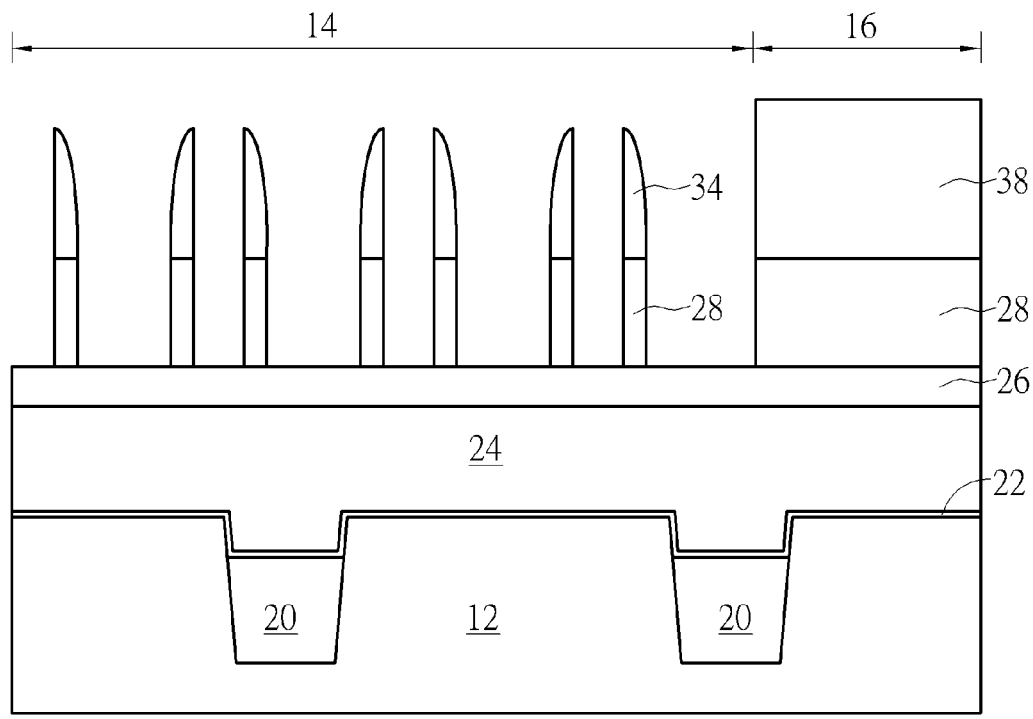

Referring to FIGS. 8-9, FIGS. 8-9 illustrate another approach for fabricating semiconductor device according to an embodiment of the present invention. In this embodiment, instead of trimming the sidewall spacers before forming the patterned mask, the trimming of the sidewall spacer could also be conducted after forming the patterned mask 38 covering the second region 16 of the substrate. For instance, as shown in FIG. 8, after gate slot cut patterning process is conducted to turn rectangular sidewall spacers into columnar sidewall spacers, a patterned mask 38 could be formed on the second hard mask 28 covering the second region 16, and an etching process is conducted by using the patterned mask 38 and sidewall spacers 34 as mask to remove part of the second hard mask 28.

Next, as shown in FIG. 9, a trimming process is conducted on the exposed sidewall spacers 34 and the patterned second hard mask 28. After the sidewall spacers 34 and patterned second hard mask 28 are trimmed, another etching process could be conducted by using the patterned mask 38, the trimmed sidewall spacers 34 and trimmed second hard mask 28 as mask to remove part of the first hard mask 26 and gate layer 24 underneath. This forms a plurality of gate structures on the substrate 12.

Figure 10:
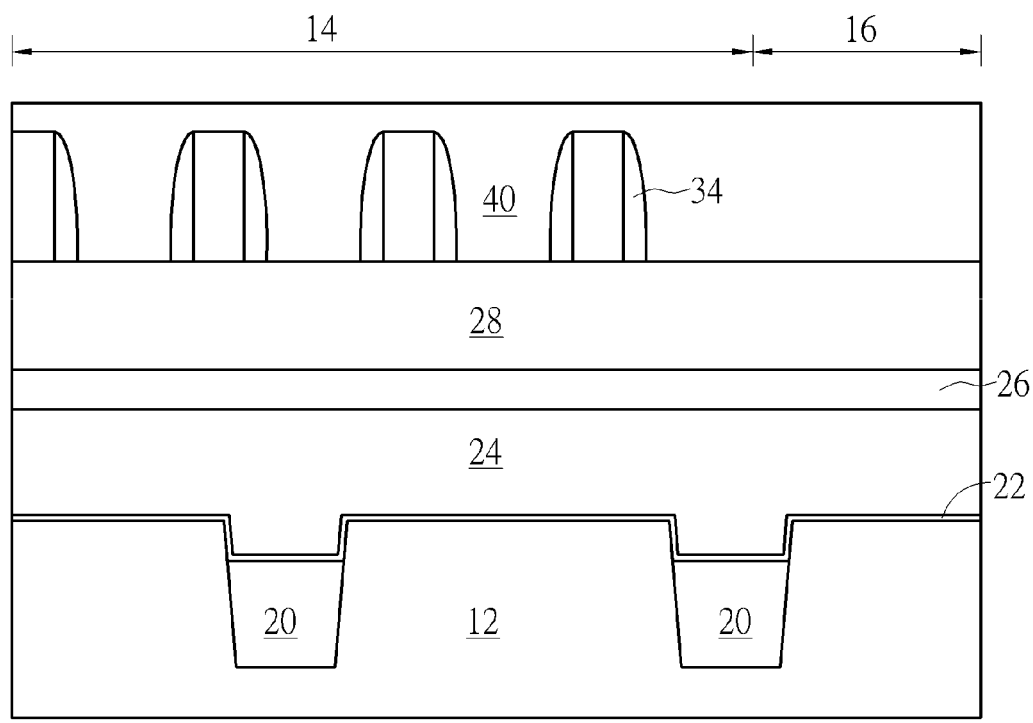
FIGS. 10-12 illustrate another approach for fabricating semiconductor device according to an embodiment of the present invention.
Figure 11:
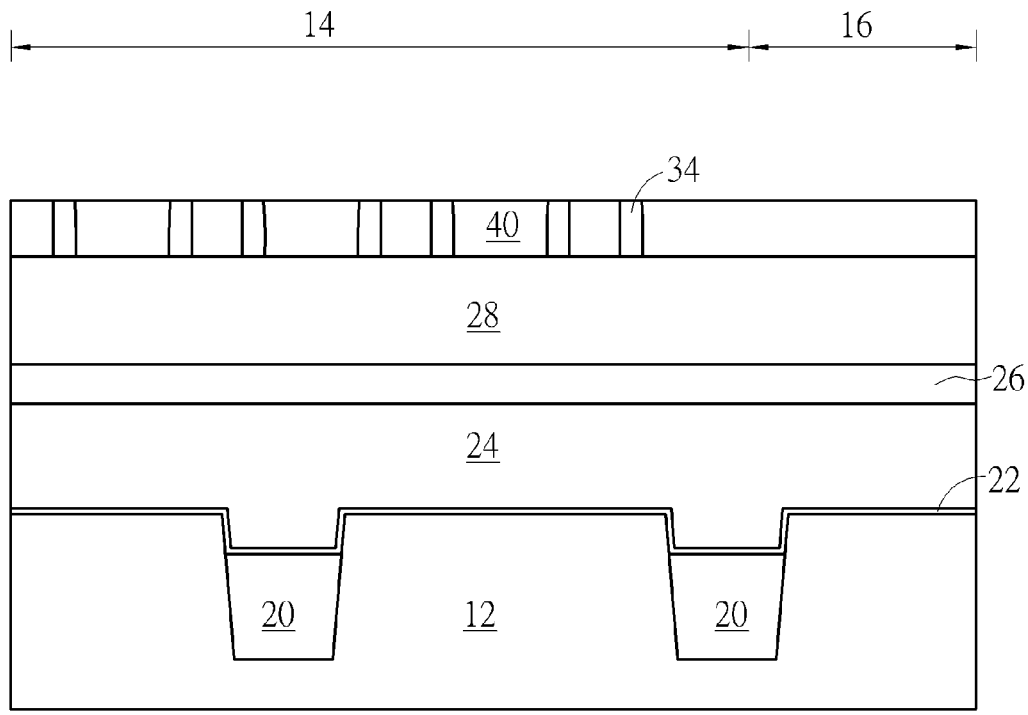
Figure 12:
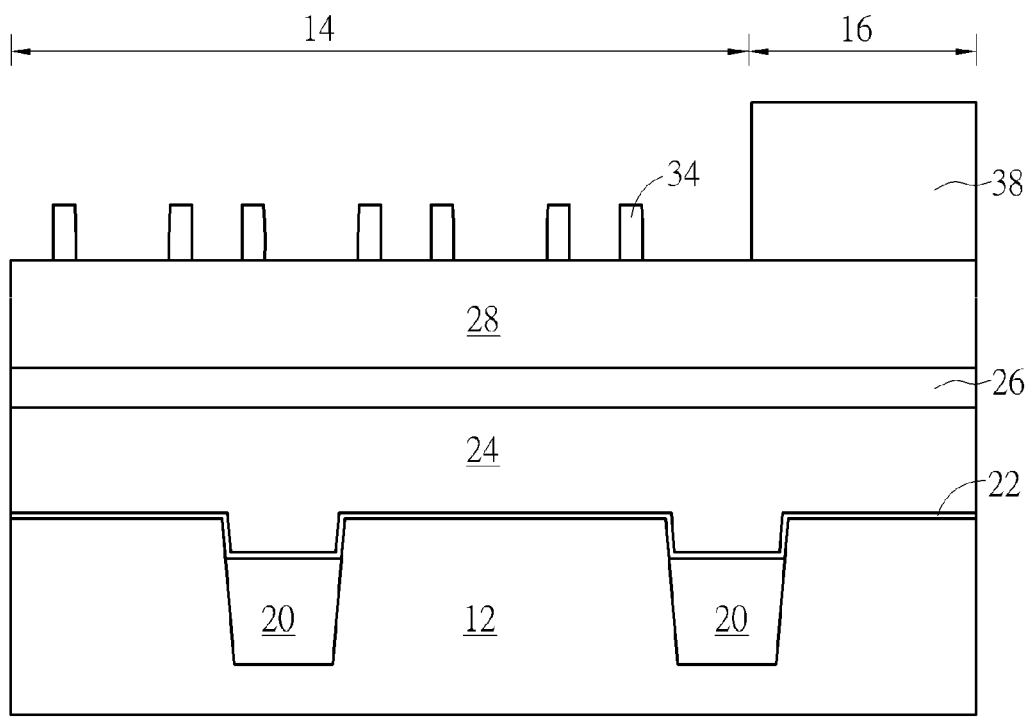

Referring to FIGS. 10-12, FIGS. 10-12 illustrate another approach for fabricating semiconductor device according to an embodiment of the present invention. In this embodiment, after sidewall spacers 34 are formed adjacent to the sacrificial mandrels 32, as shown in FIG. 10, a dielectric layer 40 is formed to cover the sidewall spacers 34 and sacrificial mandrels 32, in which the dielectric layer 40 and the sacrificial mandrels 32 are preferably composed of same material. Next, as shown in FIG. 11, a planarizing process, such as a CMP process is conducted to planarize part of the dielectric layer 40, part of the sidewall spacers 34, and part of the sacrificial mandrels 32 so that the top surfaces of the remaining sidewall spacers 34 and sacrificial mandrels 32 are even with the top surface of the dielectric layer 40. After the sidewall spacers 34 and sacrificial mandrels 32 are planarized, as shown in FIG. 12, an etching process is conducted to fully remove the dielectric layer 40 and the sacrificial mandrels 32 simultaneously, and another etching process could be conducted by using the planarized sidewall spacers 34 in the first region 14 and patterned mask 38 in the second region 16 as mask to etch the second hard mask 28, first hard mask 26, and gate layer 24 for forming a plurality of gate structures. It should be noted that since the utilization of the planarized sidewall spacers 34 increases the accuracy of pattern transfer during the aforementioned process for forming gate structures, it would also be desirable to eliminate the utilization of second hard mask 28 and first hard mask 26 so that the pattern of the sidewall spacers 34 could be transferred directly to the gate layer 24 for forming gate structures directly.

Overall, in contrast to the conventional art of using sidewall image transfer (SIT) process to form fin-shaped structures, the present invention not only utilizes the SIT technique to fabricate fin-shaped structure, but also utilizes additional SIT process to fabricate gate structures thereafter, so that as scaling down of devices continues, gate structures with substantially lower pitch could be obtained. Preferably, the fabrication could be accomplished by first forming a plurality of sacrificial mandrels on a gate layer, and after forming sidewall spacers adjacent to the sacrificial mandrels, the sacrificial mandrels are removed and the patterns of the sidewall spacers are transferred through photo-etching process to the gate layer underneath for forming a plurality of gate structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region defined thereon;
   forming a plurality of fin-shaped structures on the substrate;
   forming a gate layer on the fin-shaped structures;
   forming a material layer on the gate layer;
   patterning the material layer for forming sacrificial mandrels on the gate layer in the first region;
   forming sidewall spacers adjacent to the sacrificial mandrels;
   forming a dielectric layer on the sidewall spacers and the sacrificial mandrels;
   planarizing the dielectric layer, the sidewall spacers, and the sacrificial mandrels so that the top surfaces of the sidewall spacers and the sacrificial mandrels are even with the top surface of the dielectric layer;
   removing the sacrificial mandrels and the dielectric layer;
   forming a patterned mask on the second region, wherein the patterned mask is not formed by sidewall image transfer (SIT) process; and
   utilizing the patterned mask and the sidewall spacers to remove part of the gate layer until reaching the bottom of the gate layer.

2. The method of claim 1, wherein the gate layer comprises amorphous silicon or polysilicon.

3. The method of claim 1, wherein the material layer comprises amorphous silicon.

4. The method of claim 1, further comprising forming a silicon nitride layer and a silicon oxide layer on the gate layer before forming the material layer.

5. The method of claim 4, further comprising utilizing the sidewall spacers to remove part of the silicon nitride layer, part of the silicon oxide layer, and part of the gate layer.

6. The method of claim 1, further comprising trimming the sidewall spacers before forming the patterned mask.

7. The method of claim 1 further comprising trimming the sidewall spacers after forming the patterning mask.

8. The method of claim 1, further comprising performing a chemical mechanical polishing (CMP) process to planarize the gate layer before forming the material layer.

* * * * *